United States Patent
Chiu

(10) Patent No.: US 7,339,430 B2
(45) Date of Patent: Mar. 4, 2008

(54) RAIL-TO-RAIL OPERATIONAL AMPLIFIER WITH AN ENHANCED SLEW RATE

(75) Inventor: Jui-Te Chiu, Hsinchu (TW)

(73) Assignee: Aimtron Technology Corp., Hsinchu (TW)

( * ) Notice: Subject to any disclaimer, the term of this patent is extended or adjusted under 35 U.S.C. 154(b) by 82 days.

(21) Appl. No.: 11/460,242

(22) Filed: Jul. 26, 2006

(65) Prior Publication Data

US 2008/0024217 A1 Jan. 31, 2008

(51) Int. Cl.
*H03F 3/45* (2006.01)

(52) U.S. Cl. ...................... 330/253; 330/261

(58) Field of Classification Search ............... 330/253, 330/261, 257, 258
See application file for complete search history.

(56) References Cited

U.S. PATENT DOCUMENTS

| | | | |
|---|---|---|---|
| 4,555,673 A | 11/1985 | Huijsing et al. | |
| 5,208,552 A | 5/1993 | Ryat | |
| 5,371,474 A | 12/1994 | Wassenaar et al. | |
| 5,561,396 A | 10/1996 | Hogervorst et al. | |
| 5,745,007 A | 4/1998 | Redman-White | |
| 6,194,962 B1 * | 2/2001 | Chen | 330/9 |
| 6,356,153 B1 * | 3/2002 | Ivanov et al. | 330/253 |
| 6,696,894 B1 * | 2/2004 | Huang | 330/253 |
| 6,828,856 B2 * | 12/2004 | Sanchez et al. | 330/253 |
| 6,831,515 B2 | 12/2004 | Johnson | |
| 6,970,043 B2 * | 11/2005 | Pradhan et al. | 330/253 |

* cited by examiner

*Primary Examiner*—Henry Choe
(74) *Attorney, Agent, or Firm*—Winston Hsu

(57) ABSTRACT

A rail-to-rail operational amplifier is provided with a high-side current adjusting circuit and a low-side current adjusting circuit. On a basis of a comparison between a first input voltage and a second input voltage, the high-side current adjusting circuit adjusts a high-side bias current. Under a condition that the first input voltage is smaller than the second input voltage, the high-side current adjusting circuit increases the high-side bias current when an absolute value of a difference between the first and the second voltages increases. On a basis of the comparison between the first and the second input voltages, the low-side current adjusting circuit adjusts a low-side bias current. Under a condition that the first input voltage is larger than the second input voltage, the low-side current adjusting circuit increases the low-side bias current when the absolute value of the difference between the first and the second voltages increases.

10 Claims, 4 Drawing Sheets

RAIL-TO-RAIL OPERATIONAL AMPLIFIER WITH AN ENHANCED SLEW RATE

BACKGROUND OF THE INVENTION

1. Field of the Invention

The present invention relates to a rail-to-rail operational amplifier and, more particularly, to a rail-to-rail operational amplifier with an enhanced slew rate.

2. Description of the Related Art

FIG. 1 is a circuit diagram showing a conventional rail-to-rail operational amplifier 10. Referring to FIG. 1, the rail-to-rail operational amplifier 10 has a complementary differential input stage, which is constructed by a first and a second P-type transistors PQ1 and PQ2 and a first and a second N-type transistors NQ1 and NQ2. A source electrode of the first P-type transistor PQ1 and a source electrode of the second P-type transistor PQ2 are coupled together. A drain electrode of the first P-type transistor PQ1 and a drain electrode of the second P-type transistor PQ2 are coupled to a summing output stage 11, respectively. A constant high-side bias current source $I_{CH}$ is coupled between a high-side supply voltage $V_H$ and the mutually-coupled source electrodes of the first and the second P-type transistors PQ1 and PQ2. A first input voltage $V_{inp}$ is applied to a gate electrode of the first P-type transistor PQ1 while a second input voltage $V_{inn}$ is applied to a gate electrode of the second P-type transistor PQ2. A differential voltage DV may be defined as the first input voltage $V_{inp}$ minus the second input voltage $V_{inn}$, i.e., $DV=(V_{inp}-V_{inn})$. Under the control of the differential voltage DV, the constant high-side bias current source $I_{CH}$ is divided to flow through the first and the second P-type transistors PQ1 and PQ2

A source electrode of the first N-type transistor NQ1 and a source electrode of the second N-type transistor NQ2 are coupled together. A drain electrode of the first N-type transistor NQ1 and a drain electrode of the second N-type transistor NQ2 are coupled to the summing output stage 11, respectively. A constant low-side bias current source $I_{CL}$ is coupled between the mutually-coupled source electrodes of the first and the second N-type transistors NQ1 and NQ2 and a low-side supply voltage $V_L$. The first input voltage $V_{inp}$ is applied to a gate electrode of the first N-type transistor NQ1 while the second input voltage $V_{inn}$ is applied to a gate electrode of the second N-type transistor NQ2. Under the control of the differential voltage DV, the constant low-side bias current source $I_{CL}$ is divided to flow through the first and the second N-type transistors NQ1 and NQ2.

The summing output stage 11 combines the four current signals from the complementary differential input stage, i.e. the four current signals from the transistors PQ1, PQ2, NQ1, and NQ2. On a basis of such combination, the summing output stage 11 generates an output voltage $V_{out}$.

From the point of view with respect to a common mode voltage $V_{CM}$, the operation of the rail-to-rail operational amplifier 10 may be divided into three ranges. Within a low range of $V_L<V_{CM}<(V_L+V_{tn})$, wherein $V_{tn}$ is the turn-on threshold voltage of the N-type transistor, the operation of the rail-to-rail operational amplifier 10 is executed only from the high-side differential input pair constructed by the first and the second P-type transistors PQ1 and PQ2 because the first and the second N-type transistors NQ1 and NQ2 are disabled. Within a high range of $(V_H-|V_{tp}|)<V_{CM}<V_H$, wherein $V_{tp}$ is the turn-on threshold voltage of the P-type transistor, the operation of the rail-to-rail operational amplifier 10 is executed only from the low-side differential input pair constructed by the first and the second N-type transistors NQ1 and NQ2 because the first and the second P-type transistors PQ1 and PQ2 are disabled. Within an intermediate range of $(V_L+V_{tn})<V_{CM}<(V_H-|V_{tp}|)$, the operation of the rail-to-rail operational amplifier 10 is executed from both of the high-side and the low-side differential input pairs because the first and the second P-type transistors PQ1 and PQ2 and the first and the second N-type transistors NQ1 and NQ2 are all enabled.

The rail-to-rail operational amplifier 10 has an advantage of allowing the common mode voltage $V_{CM}$ to be applicable within the whole range from $V_L$ to $V_H$. In light of the development trend that the power supply voltage of today's electronic devices is continuously reduced, such advantage makes possible the whole range of the power supply voltage to be effectively used by the rail-to-rail operational amplifier 10.

On the other hand, today's electronic devices are required to operate at a higher speed of transmitting electronic data. More specifically, when the input voltage $V_{inp}$ and/or $V_{inn}$ of the operational amplifier changes, the output voltage $V_{out}$ of the operational amplifier will responsively change from an original state into another state. A rate of change of the output voltage with respect to time is often referred to as the slew rate. The higher the slew rate, the faster the speed of the operational amplifier. However, the conventional rail-to-rail operational amplifier 10 as shown in FIG. 1 fails to provide a higher slew rate than other operational amplifiers of different types.

Therefore, it is desirable to provide a rail-to-rail operational amplifier with an enhanced slew rate.

SUMMARY OF THE INVENTION

In view of the above-mentioned problems, an object of the present invention is to provide a rail-to-rail operational amplifier with an enhanced slew rate.

According to one aspect of the present invention, a rail-to-rail operational amplifier is provided to include a high-side differential input pair, a low-side differential input pair, a summing output stage, a high-side current adjusting circuit, and a low-side current adjusting circuit. The high-side differential input pair is controlled by a first input voltage and a second input voltage, for dividing a high-side bias current into two partial currents. The low-side differential input pair is controlled by the first input voltage and the second input voltage, for dividing a low-side bias current into two other partial currents. The summing output stage combines the two partial currents and the two other partial currents, and generates an output voltage on a basis of the combination. On a basis of a comparison between the first and the second input voltages, the high-side current adjusting circuit increases the high-side bias current when an absolute value of a difference between the first and the second voltages increases under a condition that the first input voltage is smaller than the second input voltage. On a basis of the comparison between the first and the second input voltages, the low-side current adjusting circuit increases the low-side bias current when the absolute value of the difference between the first and the second voltages increases under a condition that the first input voltage is larger than the second input voltage.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
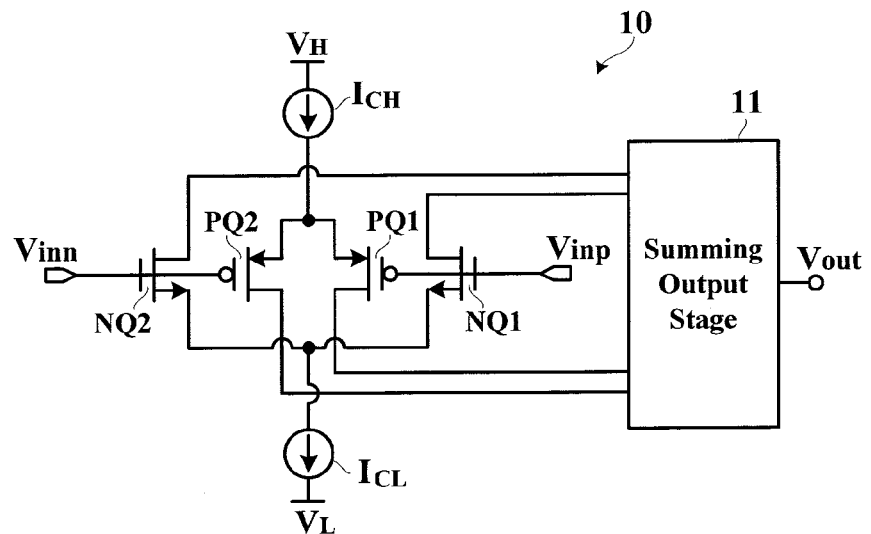
FIG. 1 is a circuit diagram showing a conventional rail-to-rail operational amplifier.
Figure 2:
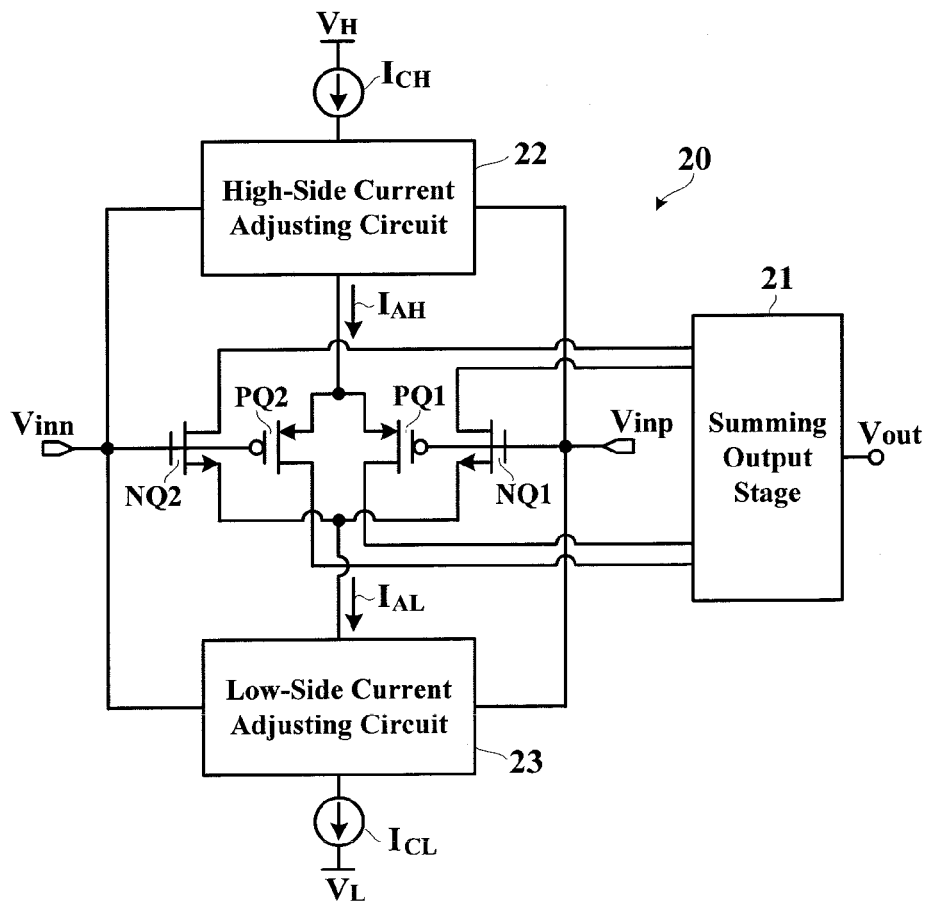
FIG. 2 is a circuit diagram showing a rail-to-rail operational amplifier according to the present invention.

FIG. 2 is a circuit diagram showing a rail-to-rail operational amplifier 20 according to the present invention. The rail-to-rail operational amplifier 20 according to the present invention is different from the conventional rail-to-rail operational amplifier 10 in that the rail-to-rail operational amplifier 20 according to the present invention utilizes a high-side current adjusting circuit 22 for providing an adaptive high-side bias current $I_{AH}$ and a low-side current adjusting circuit 23 for providing an adaptive low-side bias current $I_{AL}$.

Referring to FIG. 2, the rail-to-rail operational amplifier 20 is provided with a high-side differential input pair and a low-side differential input pair. The high-side differential input pair is constructed by a first and a second P-type transistors PQ1 and PQ2 while the low-side differential input pair is constructed by a first and a second N-type transistors NQ1 and NQ2. Therefore, the high-side and the low-side differential input pairs together form a complementary differential input stage. It should be noted that although the P-type transistor in FIG. 2 is implemented by a PMOS transistor, it may also be implemented by a pnp bipolar transistor. It should be noted that although the N-type transistor in FIG. 2 is implemented by an NMOS transistor, it may also be implemented by an npn bipolar transistor.

A source electrode of the first P-type transistor PQ1 and a source electrode of the second P-type transistor PQ2 are coupled together. A drain electrode of the first P-type transistor PQ1 and a drain electrode of the second P-type transistor PQ2 are coupled to a summing output stage 21, respectively. A first input voltage $V_{inp}$ is applied to a gate electrode of the first P-type transistor PQ1 while a second input voltage $V_{inn}$ is applied to a gate electrode of the second P-type transistor PQ2. A constant high-side bias current source $I_{CH}$ is coupled to a high-side supply voltage $V_H$, and is also coupled to the mutually-coupled source electrodes of the first and the second P-type transistors through the high-side current adjusting circuit 22. The high-side current adjusting circuit 22 is controlled by the first and the second input voltages $V_{inp}$ and $V_{inn}$ so as to generate the adaptive high-side bias current $I_{AH}$. Therefore, the constant high-side bias current source $I_{CH}$ serves as a reference current source to be applied to the high-side current adjusting circuit 22. On a basis of a comparison between the first and the second input voltages $V_{inp}$ and $V_{inn}$, the high-side adjusting circuit 22 transforms the constant high-side bias current source $I_{CH}$ into the adaptive high-side bias current $I_{AH}$. Subsequently, the adaptive high-side bias current $I_{CH}$ is applied to the mutually-coupled source electrodes of the first and the second P-type transistors PQ1 and PQ2.

A source electrode of the first N-type transistor NQ1 and a source electrode of the second N-type transistor NQ2 are coupled together. A drain electrode of the first N-type transistor NQ1 and a drain electrode of the second N-type transistor NQ2 are coupled to the summing output stage 21, respectively. The first input voltage $V_{inp}$ is applied to a gate electrode of the first N-type transistor NQ1 while the second input voltage $V_{inn}$ is applied to a gate electrode of the second N-type transistor NQ2. A constant low-side bias current source $I_{CL}$ is coupled to the mutually-coupled source electrodes of the first and the second N-type transistors through the low-side current adjusting circuit 23, and is also coupled to a low-side supply voltage $V_L$. The low-side current adjusting circuit 23 is controlled by the first and the second input voltages V inp and $V_{inn}$ so as to generate the adaptive low-side bias current $I_{AL}$. Therefore, the constant low-side bias current source $I_{CL}$ serves as a reference current source to be applied to the low-side current adjusting circuit 23. On a basis of a comparison between the first and the second input voltages $V_{inp}$ and $V_{inn}$, the low-side adjusting circuit 23 transforms the constant low-side bias current source $I_{CL}$ into the adaptive low-side bias current $I_{AL}$. Subsequently, the adaptive low-side bias current $I_{AL}$ is applied to the mutually-coupled source electrodes of the first and the second N-type transistors NQ1 and NQ2.

Figure 3:
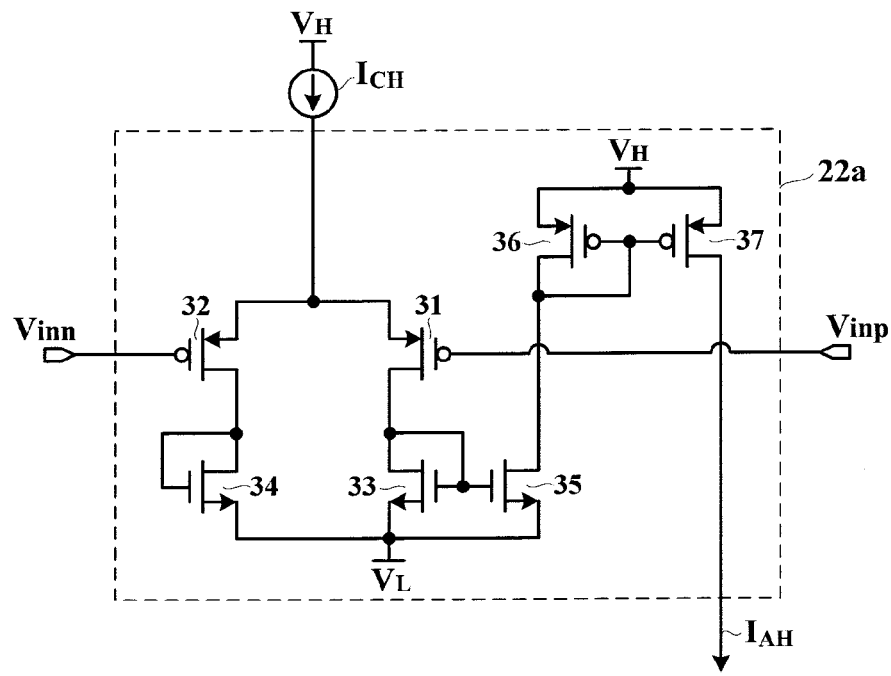
FIG. 3 is a detailed circuit diagram showing a first example of a high-side current adjusting circuit according to the present invention.

FIG. 3 is a detailed circuit diagram showing a first example 22a of a high-side current adjusting circuit 22 according to the present invention. Referring to FIG. 3, a differential adjusting unit is constructed by P-type transistors 31 and 32. A source electrode of the P-type transistor 31 is coupled to a source electrode of the P-type transistor 32. The constant high-side bias current source $I_{CH}$ is coupled to the mutually-coupled source electrodes of the P-type transistors 31 and 32. The first input voltage $V_{inp}$ is applied to a gate electrode of the P-type transistor 31 while the second input voltage $V_{inn}$ is applied to a gate electrode of the P-type transistor 32.

An N-type transistor 34 is itself coupled as a diode. The N-type transistor 34 has a gate electrode coupled to its drain electrode and further coupled to a drain electrode of the P-type transistor 32. A source electrode of the N-type transistor 34 is coupled to the low-side supply voltage $V_L$.

A current mirroring unit is constructed by N-type transistors 33 and 35 and P-type transistors 36 and 37. A gate electrode of the N-type transistor 33 and a gate electrode of the N-type transistor 35 are coupled together. The gate electrode of the N-type transistor 33 is coupled to its drain electrode and further coupled to a drain electrode of the P-type transistor 31. Source electrodes of the N-type transistors 33 and 35 are both coupled to the low-side supply voltage $V_L$. A gate electrode of the P-type transistor 36 and a gate electrode of the P-type transistor 37 are coupled together. The gate electrode of the P-type transistor 36 is coupled to its drain electrode and further coupled to a drain electrode of the N-type transistor 35. A source electrode of the P-type transistor 36 and a source electrode of the P-type transistor 37 are both coupled to the high-side supply voltage $V_H$. A drain electrode of the P-type transistor 37 supplies the adaptive high-side bias current $I_{AH}$ to the high-side differential input pair constructed by the first and the second P-type transistors PQ1 and PQ2 shown in FIG. 2.

The high-side current adjusting circuit 22a is operated on a basis of a comparison between the first input voltage $V_{inp}$ and the second input voltage $V_{inn}$. First of all, it is taken into consideration that the constant high-side bias current source $I_{CH}$ is divided into two partial currents for respectively flowing through the P-type transistors 31 and 32. When the first input voltage $V_{inp}$ gradually increases, the current proportion flowing through the P-type transistor 31 gradually decreases but the current proportion flowing through the P-type transistor 32 gradually increases. On the contrary, when the second input voltage $V_{inn}$ gradually increases, the current proportion flowing through the P-type transistor 32 gradually decreases but the current proportion flowing through the P-type transistor 31 gradually increases. Through the transferring function of the current mirroring unit, the current proportion flowing through the P-type transistor 31 is correspondingly transferred to the drain electrode of the P-type transistor 37 for serving as the adaptive high-side bias current $I_{AH}$. Therefore, the high-side current adjusting circuit 22a may effectively provide the adaptive high-side bias current $I_{AH}$ on a basis of a comparison between the first input voltage $V_{inp}$ and the second input voltage $V_{inn}$.

In one embodiment of the present invention, the width-to-length ratio $(W/L)_{P31}$ of the P-type transistor 31 is designed to be smaller than the width-to-length ratio $(W/L)_{P32}$ of the N-type transistor 32, for example, $(W/L)_{P31}$:$(W/L)_{P32}$=1:5. Therefore, when the first input voltage $V_{inp}$ is equal to the second input voltage $V_{inn}$, a major proportion of the constant high-side bias current source $I_{CH}$ is retrieved to flow through the P-type transistor 32, and only is a minor proportion allowed to flow through the P-type transistor 31. In this case, the current proportion flowing through the P-type transistor 31 is slightly decreased by a small amount if the first input voltage $V_{inp}$ becomes larger than the second input voltage $V_{inn}$, but on the contrary the current proportion flowing through the P-type transistor 31 is dramatically increased by a large amount if the first input voltage $V_{inp}$ becomes smaller than the second input voltage $V_{inn}$.

It should be noted that although the P-type transistor in FIG. 3 is implemented by a PMOS transistor, it may also be implemented by a pnp bipolar transistor. It should be noted that although the N-type transistor in FIG. 3 is implemented by an NMOS transistor, it may also be implemented by an npn bipolar transistor.

Figure 4:
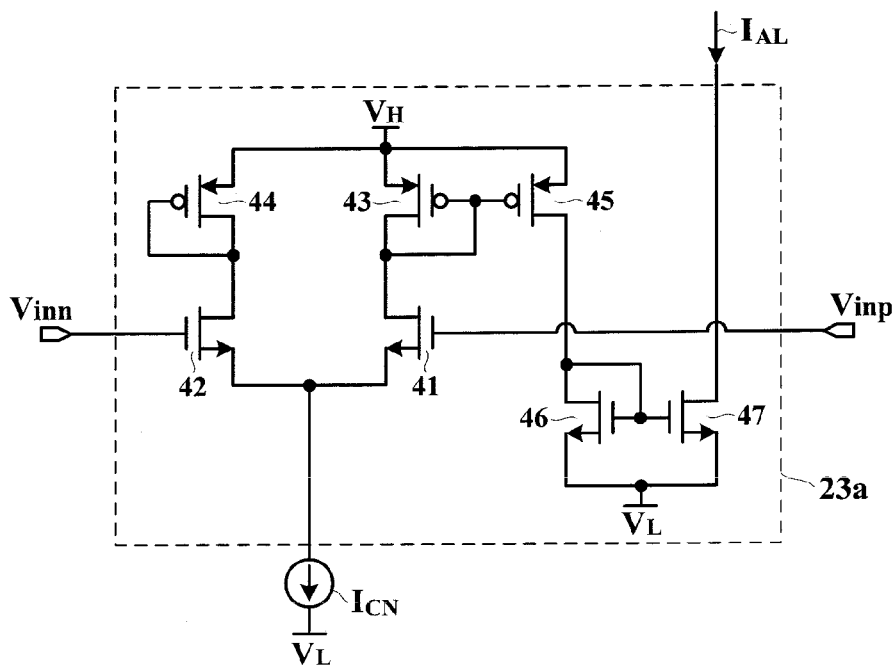
FIG. 4 is a detailed circuit diagram showing a first example of a low-side current adjusting circuit according to the present invention.

FIG. 4 is a detailed circuit diagram showing a first example 23a of a low-side current adjusting circuit 23 according to the present invention. Referring to FIG. 4, a differential adjusting unit is constructed by N-type transistors 41 and 42. A source electrode of the N-type transistor 41 is coupled to a source electrode of the N-type transistor 42. The constant low-side bias current source $I_{CL}$ is coupled to the mutually-coupled source electrodes of the N-type transistors 41 and 42. The first input voltage $V_{inp}$ is applied to a gate electrode of the N-type transistor 41 while the second input voltage $V_{inn}$ is applied to a gate electrode of the N-type transistor 42.

A P-type transistor 44 is itself coupled as a diode. The P-type transistor 44 has a gate electrode coupled to its drain electrode and further coupled to a drain electrode of the N-type transistor 42. A source electrode of the P-type transistor 44 is coupled to the high-side supply voltage $V_H$.

A current mirroring unit is constructed by P-type transistors 43 and 45 and N-type transistors 46 and 47. A gate electrode of the P-type transistor 43 and a gate electrode of the P-type transistor 45 are coupled together. The gate electrode of the N-type transistor 43 is coupled to its drain electrode and further coupled to a drain electrode of the N-type transistor 41. Source electrodes of the P-type transistors 43 and 45 are both coupled to the high-side supply voltage $V_H$. A gate electrode of the N-type transistor 46 and a gate electrode of the N-type transistor 47 are coupled together. The gate electrode of the N-type transistor 46 is coupled to its drain electrode and further coupled to a drain electrode of the P-type transistor 45. A source electrode of the N-type transistor 46 and a source electrode of the N-type transistor 47 are both coupled to the low-side supply voltage $V_L$. A drain electrode of the N-type transistor 47 supplies the adaptive low-side bias current $I_{AL}$ to the low-side differential input pair constructed by the first and the second N-type transistors NQ1 and NQ2 shown in FIG. 2.

The low-side current adjusting circuit 23a is operated on a basis of a comparison between the first input voltage $V_{inp}$ and the second input voltage $V_{inn}$. First of all, it is taken into consideration that the constant low-side bias current source $I_{CL}$ is divided into two parts for flowing through the N-type transistors 41 and 42. When the first input voltage $V_{inp}$ gradually increases, the current proportion flowing through the N-type transistor 41 gradually increases but the current proportion flowing through the N-type transistor 42 gradually decreases. On the contrary, when the second input voltage $V_{inn}$ gradually increases, the current proportion flowing through the N-type transistor 42 gradually increases but the current proportion flowing through the P-type transistor 41 gradually decreases. Through the transferring function of the current mirroring unit, the current proportion flowing through the N-type transistor 41 is correspondingly transferred to the drain electrode of the N-type transistor 47 for serving as the adaptive low-side bias current $I_{AL}$. Therefore, the low-side current adjusting circuit 23a may effectively provide the adaptive low-side bias current $I_{AL}$ on a basis of a comparison between the first input voltage $V_{inp}$ and the second input voltage $V_{inn}$.

In one embodiment of the present invention, the width-to-length ratio $(W/L)_{N41}$ of the N-type transistor 41 is designed to be smaller than the width-to-length ratio $(W/L)_{N42}$ of the N-type transistor 42, for example, $(W/L)_{P31}$:$(W/L)_{P32}$=1:5. Therefore, when the first input voltage $V_{inp}$ is equal to the second input voltage $V_{inn}$, a major part of the constant high-side bias current source $I_{CH}$ flows through the N-type transistor 42, and only is a minor part allowed to flow through the N-type transistor 41. In this case, the current proportion flowing through the N-type transistor 41 dramatically increases by a large amount if the first input voltage $V_{inp}$ becomes larger than the second input voltage $V_{inn}$, but on the contrary the current proportion flowing through the N-type transistor 41 slightly decreases by a small amount if the first input voltage $V_{inp}$ becomes smaller than the second input voltage $V_{inn}$.

It should be noted that although the P-type transistor in FIG. 4 is implemented by a PMOS transistor, it may also be implemented by a pnp bipolar transistor. It should be noted that although the N-type transistor in FIG. 4 is implemented by an NMOS transistor, it may also be implemented by an npn bipolar transistor.

Figure 5:
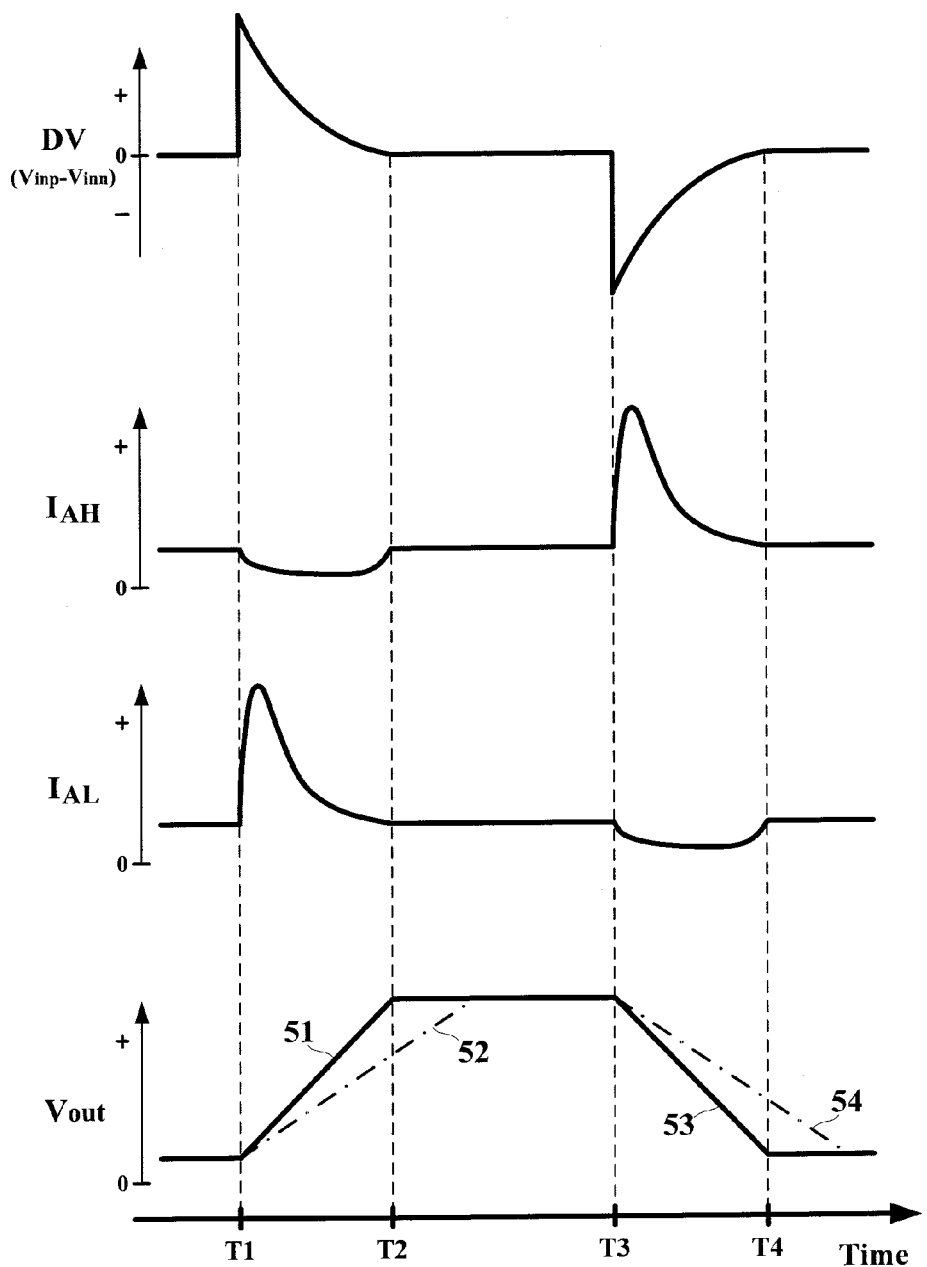
FIG. 5 is a waveform timing chart showing an operation of a rail-to-rail operational amplifier according to the present invention.

Hereinafter is described in detail an operation of the rail-to-rail operational amplifier 20 according to the present invention with reference to FIGS. 2 and 5. At time T1, it is assumed that the first input voltage $V_{inp}$ is instantaneously pulled up (or the second input voltage $V_{inn}$ is instantaneously pulled down) such that the differential voltage DV instantaneously becomes much higher than zero (i.e., an elevated step of change). As a result, the adaptive high-side bias current $I_{AH}$ generated from the high-side current adjusting circuit 22 decreases while the adaptive low-side bias current $I_{AL}$ generated from the low-side current adjusting circuit 23 increases. As clearly seen from FIG. 5, the extent of increase of the adaptive low-side bias current $I_{AL}$ is dominantly higher than the extent of decrease of the adaptive high-side bias current $I_{AH}$, resulting in an enhanced total bias current from the summation of the adaptive high-side and low-side bias currents $I_{AH}$ and $I_{AL}$. Due to the enhanced total bias current, the rail-to-rail operational amplifier 20 is operated at a higher speed. Therefore, during time T1 to T2, the slew rate of the output voltage $V_{out}$ of the rail-to-rail operational amplifier 20 is enhanced such that the output voltage $V_{out}$ performs a rapid transient from the low level to the high level, as shown by a solid line 51 in FIG. 5. To be compared, the output voltage $V_{out}$ of the conventional rail-to-rail operational amplifier 10 has a much slower slew rate, as shown by a dot-dashed line 52 in FIG. 5, since the total bias current of the conventional rail-to-rail operational amplifier 10 remains unchanged.

At time T3, it is assumed that the first input voltage $V_{inp}$ is instantaneously pulled down (or the second input voltage $V_{inn}$ is instantaneously pulled up) such that the differential voltage DV instantaneously becomes much lower than zero (i.e., a fallen step of change). As a result, the adaptive high-side bias current $I_{AH}$ generated from the high-side current adjusting circuit 22 increases while the adaptive low-side bias current $I_{AL}$ generated from the low-side current adjusting circuit 23 decreases. As clearly seen from FIG. 5, the extent of increase of the adaptive high-side bias current $I_{AH}$ is dominantly higher than the extent of decrease of the adaptive low-side bias current $I_{AL}$, resulting in an enhanced total bias current from the summation of the adaptive high-side and low-side bias currents $I_{AH}$ and $I_{AL}$. Due to the enhanced total bias current, the rail-to-rail operational amplifier 20 is operated at a higher speed. Therefore, during time T3 to T4, the slew rate of the output voltage $V_{out}$ of the rail-to-rail operational amplifier 20 is enhanced such that the output voltage $V_{out}$ performs a rapid transient from the high level to the low level, as shown by a solid line 53 in FIG. 5. To be compared, the output voltage $V_{out}$ of the conventional rail-to-rail operational amplifier 10 has a much slower slew rate, as shown by a dot-dashed line 54 in FIG. 5, since the total bias current of the conventional rail-to-rail operational amplifier 10 remains unchanged.

Figure 6:
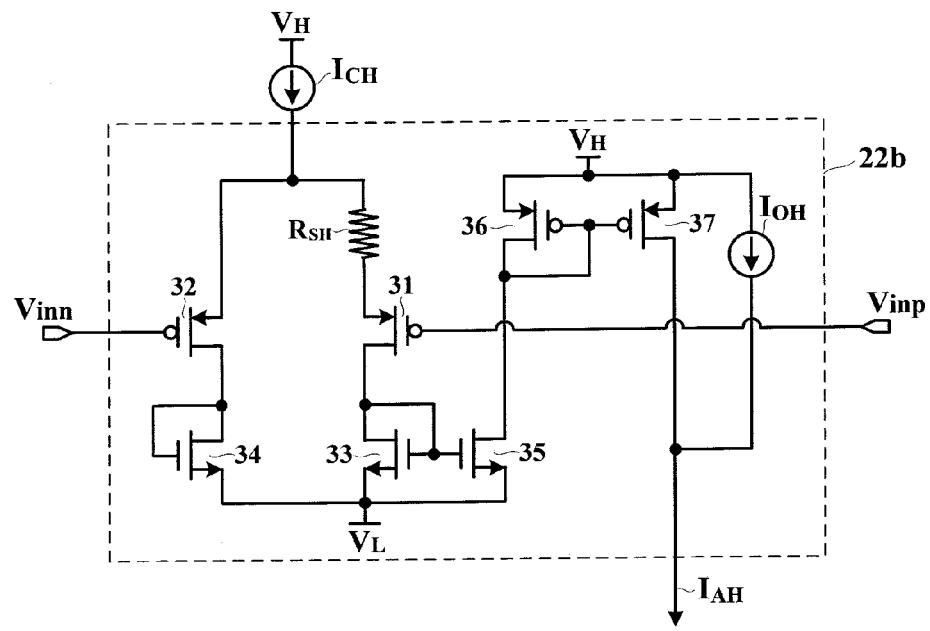
FIG. 6 is a detailed circuit diagram showing a second example of a high-side current adjusting circuit according to the present invention.

FIG. 6 is a detailed circuit diagram showing a second example 22b of a high-side current adjusting circuit 22 according to the present invention. The second example 22b of FIG. 6 is different from the first example 22a of FIG. 3 in that the second example 22b is further provided with a constant high-side compensative current source $I_{OH}$. As described above with reference to FIG. 5, the adaptive high-side bias current $I_{AH}$ slightly decreases during time T1 to T2. If the rail-to-rail operational amplifier 20 happens to operate within the low range of $V_L<V_{CM}<(V_L+V_{tn})$, the operation speed of rail-to-rail operational amplifier 20 is determined only by the adaptive high-side bias current $I_{AH}$ since only does the high-side differential input pair PQ1 and PQ2 remain enabled with respect to the complementary differential input stage. In order to prevent the operation speed from being deteriorated by the slight decrease of the adaptive high-side bias current $I_{AH}$, the high-side current adjusting circuit 22b is further provided with the constant high-side compensative current source $I_{OH}$ at the output terminal, for serving as the lower limit of the adaptive high-side bias current $I_{AH}$.

Incidentally speaking, the second example 22b of FIG. 6 may be further provided with a high-side setting resistor $R_{SH}$, which is coupled between the constant high-side bias current source $I_{CH}$ and the source electrode of the P-type transistor 31. Due to a finite potential difference $dV_H$ caused by the current flowing through the high-side setting resistor $R_{SH}$, the high-side current adjusting circuit 22b is subjected to a condition of $(V_{inp}+dV_H)<V_{inn}$ for increasing the adaptive high-side bias current $I_{AH}$. In other words, an appropriate selection of the high-side setting resistor $R_{SH}$ may effectively manipulate the operational condition of the high-side current adjusting circuit 22b.

Figure 7:
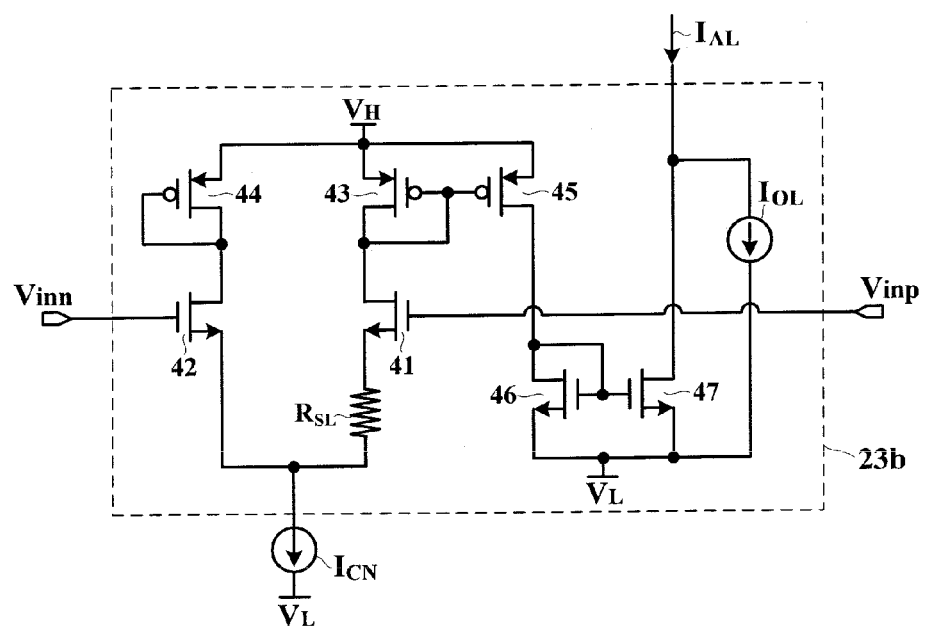
FIG. 7 is a detailed circuit diagram showing a second example of a low-side current adjusting circuit according to the present invention.

FIG. 7 is a detailed circuit diagram showing a second example 23b of a low-side current adjusting circuit 23 according to the present invention. The second example 23b of FIG. 7 is different from the first example 23a of FIG. 4 in that the second example 23b is further provided with a constant low-side compensative current source $I_{OL}$. As described above with reference to FIG. 5, the adaptive low-side bias current $I_{AL}$ slightly decreases during time T3 to T4. If the rail-to-rail operational amplifier 20 happens to operate within the high range of $(V_H-|V_{tp}|)<V_{CM}<V_H$, the operation speed of rail-to-rail operational amplifier 20 is determined only by the adaptive low-side bias current $I_{AL}$ since only does the low-side differential input pair NQ1 and NQ2 remain enabled with respect to the complementary differential input stage. In order to prevent the operation speed from being deteriorated by the slight decrease of the adaptive low-side bias current $I_{AL}$, the low-side current adjusting circuit 23b is further provided with the constant low-side compensative current source $I_{OL}$ at the output terminal, for serving as the lower limit of the adaptive low-side bias current $I_{AL}$.

Incidentally speaking, the second example 23b of FIG. 7 may be further provided with a low-side setting resistor $R_{SL}$, which is coupled between the constant low-side bias current source $I_{CL}$ and the source electrode of the N-type transistor 41. Due to a finite potential difference $dV_L$ caused by the current flowing through the low-side setting resistor $R_{SL}$, the low-side current adjusting circuit 23b is subjected to a condition of $V_{inn}<(V_{inp}+dV_L)$ for increasing the adaptive low-side bias current $I_{AL}$. In other words, an appropriate selection of the low-side setting resistor $R_{SL}$ may effectively manipulate the operational condition of the low-side current adjusting circuit 23b.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A rail-to-rail operational amplifier, comprising:
a high-side differential input pair, controlled by a first input voltage and a second input voltage, for dividing a high-side bias current into two partial currents;
a low-side differential input pair, controlled by the first input voltage and the second input voltage, for dividing a low-side bias current into two other partial currents; and
a summing output stage for combining the two partial currents and the two other partial currents, and generating an output voltage on a basis of the combination,
characterized by further comprising:
a high-side current adjusting circuit for adjusting the high-side bias current on a basis of a comparison between the first and the second input voltages, for increasing the high-side bias current when an absolute value of a difference between the first and the second voltages increases under a condition that the first input voltage is smaller than the second input voltage, and a low-side current adjusting circuit for adjusting the low-side bias current on a basis of the comparison between the first and the second input voltages, for increasing the low-side bias current when the absolute value of the difference between the first and the second voltages increases under a condition that the first input voltage is larger than the second input voltage.

2. The rail-to-rail operational amplifier according to claim 1, wherein:

the high-side current adjusting circuit decreases the high-side bias current when the absolute value of the difference between the first and the second voltages increases under the condition that the first input voltage is larger than the second input voltage, and the low-side current adjusting circuit decreases the low-side bias current when the absolute value of the difference between the first and the second voltages increases under the condition that the first input voltage is smaller than the second input voltage.

3. The rail-to-rail operational amplifier according to claim 1, wherein:

the high-side current adjusting circuit comprises:

a differential adjusting unit, controlled by the first input voltage and the second input voltage, for dividing a constant high-side bias current source into a first current and a second current, such that the first current is increased when the absolute value of the difference between the first and the second voltages increases under the condition that the first input voltage is smaller than the second input voltage, and a current mirroring unit for transferring the first current to serve as the high-side bias current.

4. The rail-to-rail operational amplifier according to claim 3, wherein:

the differential adjusting unit comprises:

a first P-type transistor having a source electrode, a gate electrode, and a drain electrode, the source electrode being coupled to the constant high-side bias current source, the gate electrode being controlled by the first input voltage, the drain electrode being coupled to the current mirroring unit, and a second P-type transistor having a source electrode, a gate electrode, and a drain electrode, the source electrode being coupled to the constant high-side bias current source, the gate electrode being controlled by the second input voltage, the drain electrode being coupled to a low-side supply voltage, wherein a width-to-length ratio of the first P-type transistor is designed to be smaller than a width-to-length ratio of the second P-type transistor.

5. The rail-to-rail operational amplifier according to claim 3, wherein:

the first current is decreased when the absolute value of the difference between the first and the second voltages increases under the condition that the first input voltage is larger than the second input voltage.

6. The rail-to-rail operational amplifier according to claim 5, wherein:

the high-side current adjusting circuit further comprises:

a high-side compensative current source for serving as a lower limit of the high-side bias current.

7. The rail-to-rail operational amplifier according to claim 1, wherein:

the low-side current adjusting circuit comprises:

a differential adjusting unit, controlled by the first input voltage and the second input voltage, for dividing a constant low-side bias current source into a third current and a fourth current, such that the third current is increased when the absolute value of the difference between the first and the second voltages increases under the condition that the first input voltage is larger than the second input voltage, and a current mirroring unit for transferring the third current to serve as the high-side bias current.

8. The rail-to-rail operational amplifier according to claim 7, wherein:

the differential adjusting unit comprises:

a first N-type transistor having a source electrode, a gate electrode, and a drain electrode, the source electrode being coupled to the constant low-side bias current source, the gate electrode being controlled by the first input voltage, the drain electrode being coupled to the current mirroring unit, and a second N-type transistor having a source electrode, a gate electrode, and a drain electrode, the source electrode being coupled to the constant low-side bias current source, the gate electrode being controlled by the second input voltage, the drain electrode being coupled to a high-side supply voltage, wherein a width-to-length ratio of the first N-type transistor is designed to be smaller than a width-to-length ratio of the second N-type transistor.

9. The rail-to-rail operational amplifier according to claim 7, wherein:

the third current is decreased when the absolute value of the difference between the first and the second voltages increases under the condition that the first input voltage is smaller than the second input voltage.

10. The rail-to-rail operational amplifier according to claim 9, wherein:

the low-side current adjusting circuit further comprises:

a low-side compensative current source for serving as a lower limit of the low-side bias current.

* * * * *